US009673797B2

United States Patent
Kim et al.

(10) Patent No.: US 9,673,797 B2
(45) Date of Patent: Jun. 6, 2017

(54) PEAK DETECTOR USING CHARGE PUMP AND BURST-MODE TRANSIMPEDANCE AMPLIFIER

(71) Applicant: ELECTRONICS AND TELECOMMUNICATIONS RESEARCH INSTITUTE, Daejeon-si (KR)

(72) Inventors: Young Ho Kim, Sejong-si (KR); Eui Suk Jung, Daejeon-si (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 14/924,955

(22) Filed: Oct. 28, 2015

(65) Prior Publication Data

US 2016/0118970 A1   Apr. 28, 2016

(30) Foreign Application Priority Data

Oct. 28, 2014   (KR) .................. 10-2014-0147743

(51) Int. Cl.
    *H03K 5/153*   (2006.01)
    *H03K 5/1532*   (2006.01)
    (Continued)

(52) U.S. Cl.
    CPC .......... *H03K 5/1532* (2013.01); *G01R 19/04* (2013.01); *H03F 3/45183* (2013.01);
    (Continued)

(58) Field of Classification Search
    CPC .. G01R 19/04; G01R 19/0038; H03K 5/1532; H03K 5/082; G11B 20/10009
    (Continued)

(56) References Cited

U.S. PATENT DOCUMENTS 5,025,176 A *  6/1991  Takeno ........................ 327/58
7,109,466 B2   9/2006  Park et al.
(Continued)

FOREIGN PATENT DOCUMENTS

| KR | 100575981 B1 | 4/2006 |
| KR | 100813462 B1 | 3/2008 |
| KR | 101009806 B1 | 1/2011 |

OTHER PUBLICATIONS

Hwang-Cherng Chow, et al; "A High Performance Peak Detector Sample and Hold Circuit for Detecting Power Supply Noise", Published in: Circuits and Systems, 2008, APCCAS 2008. IEEE Asia Pacific Conference on; Nov. 30, 2008-Dec. 3, 2008; pp. 672-675.

*Primary Examiner* — Quan Tra
(74) *Attorney, Agent, or Firm* — Ladas & Parry LLP (57) ABSTRACT

A peak detector using a charge pump is provided. The peak detector includes a differential amplifier configured to receive an input signal to be detected through an input node and amplify the received signal; a current control logic configured to create two or more current control signals by comparing a signal output from the differential amplifier with two or more reference voltages; a mirror current source portion comprising two or more mirror current sources configured to be driven respectively by the current control signals from the current control logic; a capacitor configured to be charged or discharged by currents output from the mirror current sources; and a reset circuit configured to reset a voltage of the capacitor.

19 Claims, 11 Drawing Sheets

(51) Int. Cl.
  *H03G 3/30*  (2006.01)
  *G01R 19/04*  (2006.01)
  *H03F 3/45*  (2006.01)

(52) U.S. Cl.
  CPC ..... *H03F 3/45475* (2013.01); *H03F 3/45968* (2013.01); *H03G 3/30* (2013.01); *H03G 3/3084* (2013.01); *H03F 2200/435* (2013.01); *H03F 2200/453* (2013.01); *H03F 2203/45138* (2013.01); *H03F 2203/45212* (2013.01)

(58) Field of Classification Search
  USPC .......................................................... 327/58
  See application file for complete search history.

(56) References Cited

U.S. PATENT DOCUMENTS

| | | | |
|---|---|---|---|
| 7,135,892 B2* | 11/2006 | Doyle et al. | 327/58 |
| 7,372,382 B2* | 5/2008 | Hazucha et al. | 341/110 |
| 7,893,756 B2* | 2/2011 | Pamperin et al. | 327/543 |
| 7,898,300 B2 | 3/2011 | Lim | |
| 2004/0190913 A1 | 9/2004 | Seo et al. | |
| 2006/0068730 A1 | 3/2006 | Khorram | 455/226.1 |
| 2007/0126481 A1* | 6/2007 | Chen | 327/59 |
| 2010/0067924 A1 | 3/2010 | Noda et al. | |
| 2011/0129235 A1* | 6/2011 | Le et al. | 398/208 |
| 2012/0062192 A1* | 3/2012 | Okuma | 323/272 |

* cited by examiner

PEAK DETECTOR USING CHARGE PUMP AND BURST-MODE TRANSIMPEDANCE AMPLIFIER

CROSS-REFERENCE TO RELATED APPLICATION(S)

This application claims priority from Korean Patent Application No. 10-2014-0147743, filed on Oct. 28, 2014, in the Korean Intellectual Property Office, the disclosure of which is incorporated herein by reference in its entirety.

BACKGROUND

1. Field

The following description relates to a signal level detector used in an electronic circuit, and more particularly, to a peak detector and peak detection method for quickly detecting a peak value of a signal.

Also, the following description discloses a method, associated with a photoelectric amplifier, for processing a signal with low distortion by quickly and stably detecting a signal intensity of burst data and actively controlling a gain of the signal.

2. Description of the Related Art

Signal amplitude and strength detection is a technology that is essential for detecting or recovering data, without errors, in response to a wide range of changes in strength of input signals. Hence, signal detection technologies have been widely applied to the systems that receive wide-dynamic-area signals, for example, wired/wireless communication systems, measurement equipment, bio-health care and medical devices, disk drives, and so on.

Figure 1A:
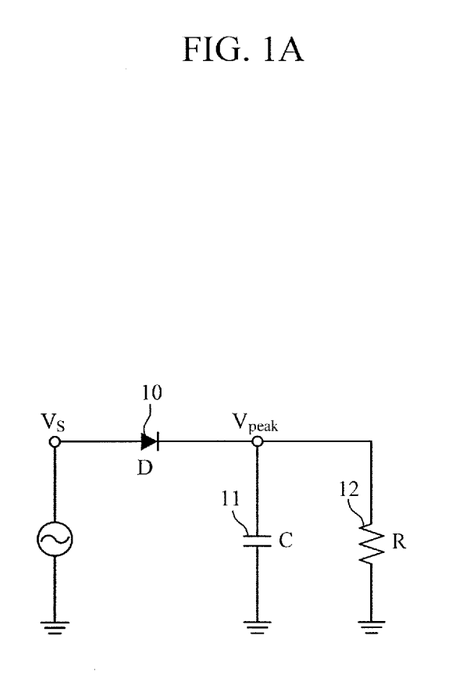
FIG. 1A is a diagram illustrating an example of a general peak detector.

Generally, a detector, as shown in FIG. 1A, is used to obtain a peak value of a signal. Referring to FIG. 1A, in a diode D 10, forward current flows from a $V_s$ node to a $V_{peak}$ node, and reverse current flowing from the $V_{peak}$ node to the $V_s$ node is cut off. If a voltage of the $V_s$ node is greater than the $V_{peak}$ node, current ideally flows through the diode 10 and the current runs through a capacitor C 11, whereby the capacitor C 11 is charged. Ideally, a voltage of the $V_{peak}$ node reaches the voltage of the $V_s$ node. However, when the voltage of the $V_{peak}$ node increases beyond the voltage of the $V_s$ node, the current flowing through the diode 10 is cut off, so that the $V_{peak}$ node and the $V_s$ node are electrically separated from each other. At this time, the $V_{peak}$ node remains at the voltage reached just before the current flow through the diode D was cut off. Accordingly, the voltage of the $V_{peak}$ node appears to track the peak value of the $V_s$ node signal. Additionally, if a resistor R 12 with a specific value is connected in parallel with the capacitor C 11 and induces discharge of the capacitor C 11, it may be utilized in tracking the envelope of the signal.

Figure 1B:
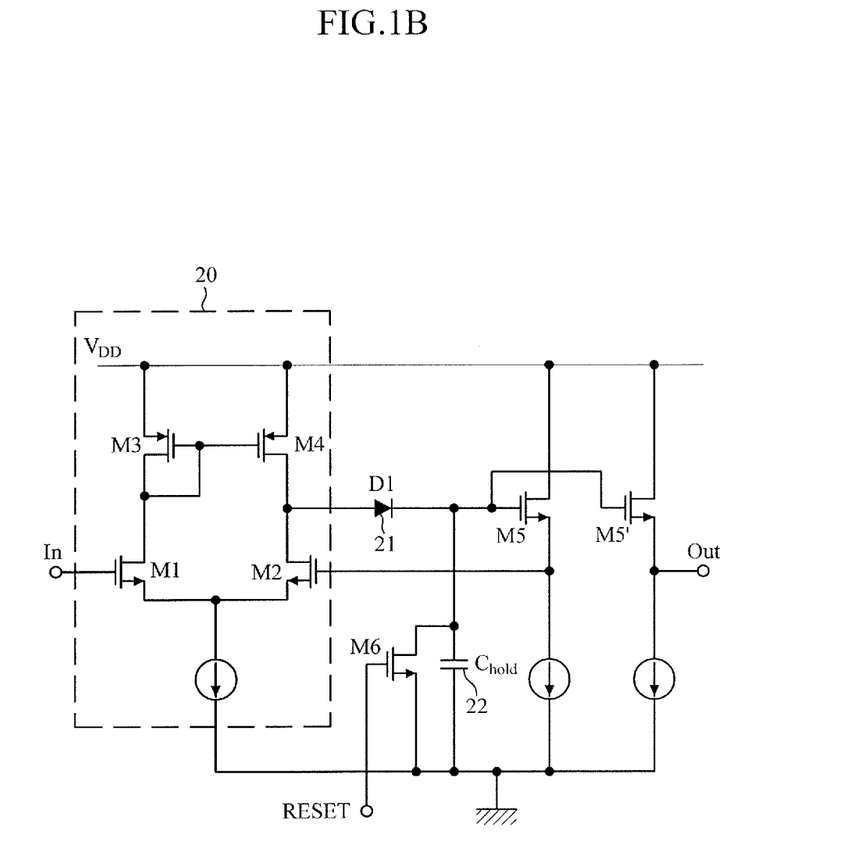
FIG. 1B is a diagram illustrating a peak detector of an integrated circuit according to a related art.

FIG. 1B is a circuit diagram illustrating an example of a peak detector in a high-frequency integrated circuit.

Referring to FIG. 1B, the peak detector is applied to the integrated circuit, and includes an amplifier consisting of MOSFET1 M1, MOSFET2 M2, MOSFET 3, M3, MOSFET 4 M4, and a current source. A signal is input to a positive input node In of the amplifier 20 and an output of the amplifier 20 is fed back to a negative input node through a source follower, whereby an output node of the amplifier 20 copies the input signal intact. In this feedback circuit, a detector as described above is inserted between the output node of the amplifier and the source follower, whereby the input signal (at a gate of M1) is less affected by the load (parasitic capacitance). The higher the frequency of a signal, the more the signal is affected by the load. Thus, the detector uses the amplifier to reduce a load value, rather than using a diode with a high parasitic capacitance, and still provides the same operating characteristics as the detector with a diode.

The aforementioned peak detectors are advantageous in terms of stability, but have limitations in application to technologies (e.g., NG-PON2) that relate to prompt detection of signal peak values with a faster response time.

A diode used for signal detection appears as a capacitor component to the high-frequency signal, and hence forward signal detection and charge/discharge processes are performed simultaneously. Hence, a correct peak value of the input signal cannot be detected; rather only an average of the input signal is detected, and it even takes a substantial amount of time to obtain the average of the signal.

In optical communication applications, for example, high-speed clocks 0 and 1 are repeated in a preamble during which the signal intensity is detected and a maximum value of the detected signal is only half of the original intensity of an input signal. This is because the values of "0" and "1" are averaged due to the charge/discharge process by the aforesaid parasitic capacitor component. Consequently, the detected value is smaller than the original peak value of the signal, resulting in degradation of resolution.

Also, the integrated diode occupies a large area, and high-frequency diode processing, such as Schottky barrier diode, has to be supported in order to realize high-speed operation.

SUMMARY

In order to solve the aforesaid drawbacks of the existing peak detection apparatuses, such as, a long detection time, a degraded resolution, a diode with a large area, and the necessity of supporting the high-frequency diode processing, the following description provides a signal peak detector using a charge pump, which is capable of detecting a peak value of a signal at a high speed by using a plurality of mirror currents with different binary weighted current ratios being connected in parallel with each other and charging a capacitor with currents from the mirror current sources which are sequentially switched off.

The following description relates to a peak detector capable of detecting a peak value of a signal at a high speed and a burst-mode transimpedance amplifier using the peak detector.

In one general aspect, there is provided a peak detector using a charge pump, including: a differential amplifier configured to receive an input signal to be detected through an input node and amplify the received signal; a current control logic configured to create two or more current control signals by comparing a signal output from the differential amplifier with two or more reference voltages; a mirror current source portion comprising two or more mirror current sources configured to be driven respectively by the current control signals from the current control logic; a capacitor configured to be charged or discharged by currents output from the mirror current sources; and a reset circuit configured to reset a voltage of the capacitor.

In another general aspect, there is provided a burst-mode transimpedance amplifier (BM-TIA) including: a TIA core configured to convert a current signal input from an external source into a voltage signal and amplify the voltage signal; a single-to-differential (S2D) amplifier configured to convert the single voltage signal output from the TIA core into a first differential signal and amplify the first differential signal; an auto offset cancellation (AOC) amplifier configured to remove DC offset from the amplified first differential signal output from the S2D amplifier and amplify a resulting signal, thereby outputting a second differential signal; a buffer amplifier configured to receive the second differential signal and output a differential output signal to an external device by amplifying the second differential signal; a peak detector configured to detect a peak voltage $V_{peak}$ of the voltage signal output from the TIA core; a dummy TIA configured to be the same as the TIA core and generate a first reference voltage $V_{ref1}$; a reference voltage generator configured to receive the first reference voltage $V_{ref1}$ and generate a second reference voltage $V_{ref2}$; a comparator configured to compare the peak voltage $V_{peak}$ and the second reference voltage $V_{ref2}$ and output a comparison result value; and a latch configured to provide time synchronization to a reset pulse signal according to the comparison result value output from the comparator, wherein an output signal from the latch is fed back to the TIA core and the dummy TIA so as to be used as a signal to control the gain of TIA core and dummy TIA.

Other features and aspects will be apparent from the following detailed description, the drawings, and the claims.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness.

Figure 2:
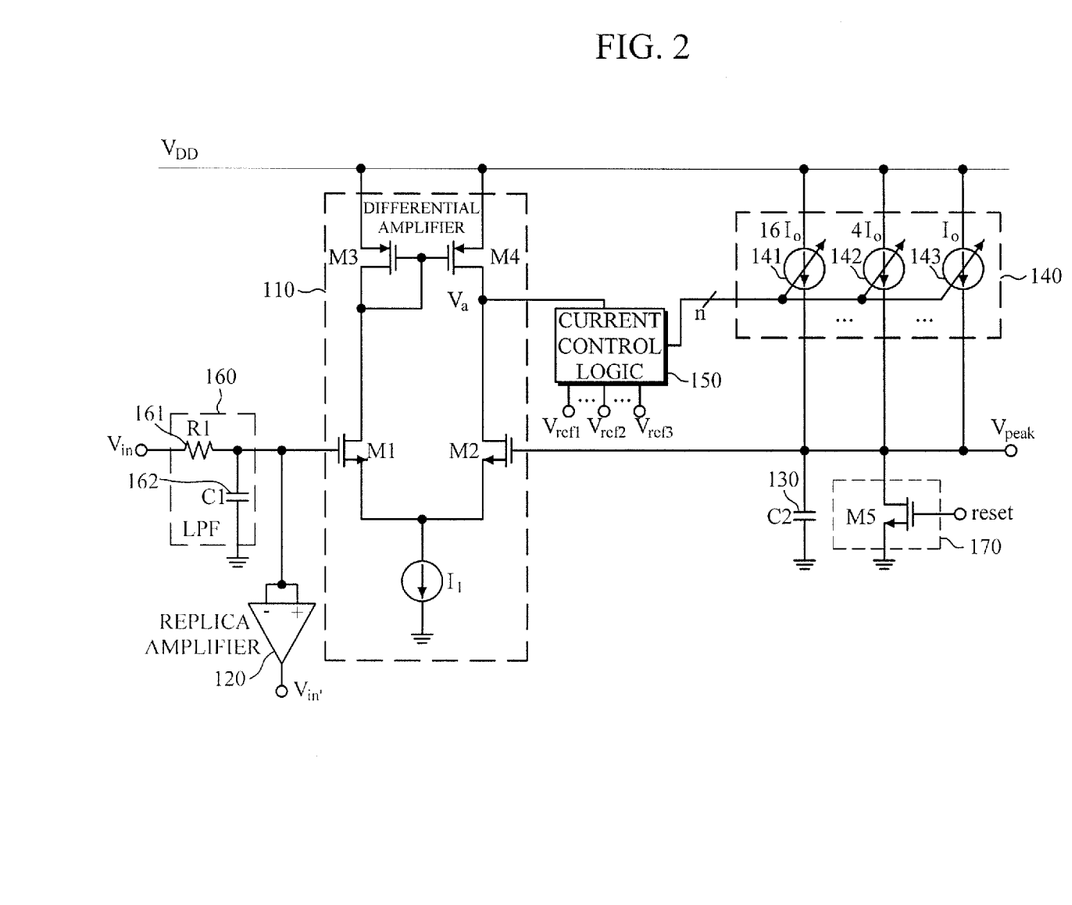
FIG. 2 is a diagram illustrating a configuration of a signal peak detector using a charge pump according to an exemplary embodiment.

FIG. 2 is a diagram illustrating a configuration of a signal peak detector using a charge pump according to an exemplary embodiment.

Referring to FIG. 2, the signal peak detector using a charge pump includes a differential amplifier 110, a replica amplifier 120, a capacitor C2 130, a mirror current source portion 140, and a current control logic 150. Also, the signal peak detector further includes a low pass filter (LPF) 160 and a reset circuit 170.

The differential amplifier 110 generates a positive output voltage by amplifying an input signal voltage $V_{in}$ applied to a positive input node. The differential amplifier 110 includes a first MOSFET M1, a second MOSFET M2, a third MOSFET M3, and a fourth MOSFET M4, wherein the first MOSFET M1 has a source connected to a current source $I_1$ and a gate connected to a positive input node; the second MOSFET M2 has a source connected to both a current source $I_1$ and the source of the first MOSFET M1 and a gate connected to a negative input node; the third MOSFET M3 has a source terminal connected to VDD, a gate connected to a gate of the fourth MOSFET M4, and a drain connected to a drain of the first MOSFET M1; the fourth MOSFET M4 has a source terminal connected to VDD, the gate connected to the gate and drain of the third MOSFET M3, and a drain connected to a drain of the second MOSFET M2; and an output node to output an output voltage $V_a$ is formed at the drain of the fourth MOSFET M4. However, the above is merely an exemplary embodiment, and aspects of the present disclosure are not limited thereto. In the present disclosure, in order to detect a positive peak value, the differential amplifier 110 receives an input signal voltage $V_{in}$ to be detected through the positive input node, receives a charged feedback voltage from the capacitor through a negative input node, and generates a positive output voltage $V_a$ by amplifying the difference between the input signal voltage $V_{in}$ and the feedback voltage. In the same manner, in order to detect a negative peak value, the differential amplifier 110 receives an input signal voltage $V_{in}$ of interest through the positive input node, receives a charged feedback voltage from the capacitor through a negative input node, and generates a negative output voltage $V_a$ by amplifying the difference between the input signal voltage $V_{in}$ and the feedback voltage.

The replica amplifier 120 has the same configuration as the differential amplifier 110, except that a positive node and a negative node both receive the same input signal voltage $V_{in}$ to generate a new output voltage $V_{in'}$.

The LPF 160, which is a primary filter consisting of R1 161 and C1 162, filters DC wander from the input signal voltage $V_{in}$, thereby selecting only a stable clock, and a resultant filtered signal is input to both the differential amplifier 110 and the replica amplifier 120 which are connected in parallel with each other.

The voltage $V_{peak}$ charged in the capacitor C2 130 is a value that tracks a peak value of the input signal voltage and is input to the negative input node of the differential amplifier 110. The current control logic 150 compares the output voltage $V_a$ of the differential amplifier 110 with a number of reference voltages obtained through the output voltage $V_{in'}$ of the replica amplifier 120, and generates control voltages for sequentially switching ON and OFF a plurality of mirror current sources in the mirror current source portion 140.

The mirror current source portion 140 is a block that supplies current as the charging voltage $V_{peak}$ of the capacitor 130 approaches a peak value of the input voltage $V_{in}$. The mirror current source portion 140 includes two or more parallel connected mirror current sources 141, 142, and 143 which have a different binary weighted current ratio from each other (in FIG. 2, a mirror current source 141 of 16 $I_o$, a mirror current source 142 of 4 $I_o$, and a mirror current source 143 of $I_o$). Since a voltage $V_{peak}$ is a comparison voltage of the input signal voltage $V_{in}$ and it is initially smaller than the input signal voltage $V_{in}$, all mirror current sources 141, 142, and 143 are switched ON, thereby quickly charging the capacitor C2 130. Accordingly, the charging voltage $V_{peak}$ swiftly approaches the voltage of the input signal Vin. As the charging voltage $V_{peak}$ nears a peak voltage $V_{peak}$ of the input signal $V_{in}$, the mirror current sources are sequentially switched OFF, starting from the mirror current source 141 of the highest binary weighted current ratio (141>142>143). When the input voltage $V_{in}$ and the charging voltage $V_{peak}$ become substantially the same as each other, the mirror current source 143 that supplies the smallest amount of current is finally switched OFF, whereby all the mirror current sources 141, 142, and 143 are entirely switched OFF. The mirror current source portion 140 is switched ON or OFF under the control of the current control logic 150 and each mirror current source charges a current of a different value in the capacitor C2 130. When tracking the amplitude of an initial input signal, all current sources are activated so that the charging voltage can approach an approximate amplitude of the signal, and when detecting the accurate peak value of the single, the mirror current source of the smallest binary weighted current ratio that supplies the finest current is activated to enhance the precision of the charging voltage.

Although the three mirror current sources are used in the above exemplary embodiment, for more accurate operation, more mirror current sources may be used. Furthermore, although a plurality of mirror current sources with different binary weighted current ratios are used in the above exemplary embodiment, numerous mirror current sources of the same binary weighted current ratio may be used in another exemplary embodiment, wherein a MUX is used to adjust current bits with weights applied thereto. For example, if three current sources of the same binary weighted current ratio are provided, the current control logic may use three bits (e.g., 101 and 010) to adjust the amount of current.

In the exemplary embodiment, in the case where a positive peak value (a peak value at the time of a positive signal being applied to a non-signal reference DC value) of an input signal is to be detected, current of the mirror current source portion 140 charges the capacitor 130 that has been set to the lowest comparison voltage $V_{peak}$ by the reset circuit 170. Inversely, in the case where a negative peak value (a peak value at the time of a negative signal being applied to a non-signal reference DC value: signal inversion) of an input signal is to be detected, the capacitor 130 that has been set to the highest comparison voltage $V_{peak}$ by the reset circuit 170 is discharged by currents of the mirror current source portion 140.

Figure 3:
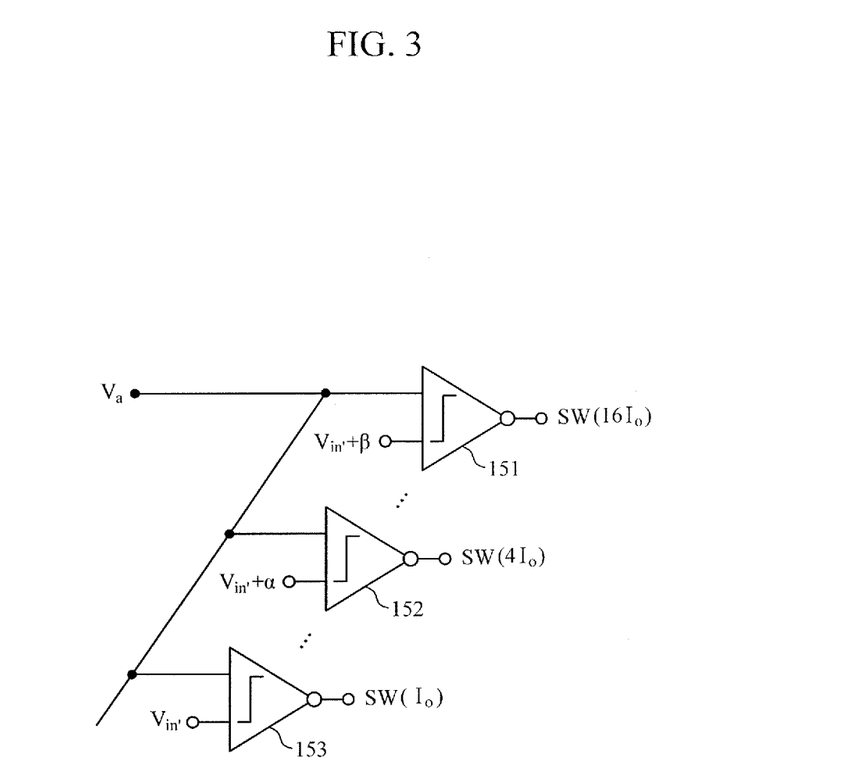
FIG. 3 is a diagram illustrating a current control logic according to the exemplary embodiment.

FIG. 3 is a diagram illustrating a current control logic according to the exemplary embodiment.

Referring to FIG. 3, the current control logic 150 includes a plurality of comparators 151, 152 and 153 which receive an output voltage $V_a$ of the differential amplifier 120 and compare the received output voltage $V_a$ to each of reference voltages $V_{ref1}$, $V_{ref2}$, and $V_{ref3}$. Output values of the comparators 151, 152, and 153 are used for switching the respective mirror current sources 141, 142, and 143. Specifically, a first comparator 151 outputs a switching control signal for the 16 $I_o$ mirror current source 141 according to a result of the comparison between the output voltage $V_a$ and a first reference voltage $V_{ref1}=V_{in'}+\beta$. A second comparator 152 outputs a switching control signal for the 4 $I_o$ mirror current source 142 according to a result of the comparison between the output voltage $V_a$ and a second reference voltage $V_{ref2}=V_{in'}+\alpha$. A third comparator 153 outputs a switching control signal for the $I_o$ mirror current source 142 according to a result of the comparison between the output voltage $V_a$ and a third reference voltage $V_{ref3}=V_{in'}$.

Hereinafter, peak detection operations of the peak detector using a charge pump will be described with reference back to FIG. 2.

If a high-speed digital preamble signal $V_{in}$ of "0101" is input, DC wander is filtered out from the input signal $V_{in}$ by the LPF 160 so as to select only a stable clock, and a resultant signal is divided into two portions which are input to a first amplifier 110 and a second amplifier 120.

The signal portion which is input to a positive input node of the first amplifier 110 is amplified and then output as a positive output signal $V_a$.

Meanwhile, the other signal portion is equally input to the positive node and the negative node of the second amplifier 120, which in turn generates a new output $V_{in'}$.

The output signal $V_a$ is input to the current control logic 150. The current control logic 150 compares a value of the received signal $V_a$ to each of reference voltages $V_{ref1}$, $V_{ref2}$, and $V_{ref3}$ obtained based on the output $V_{in'}$ from the second amplifier 120 and outputs a value of 0 (LOW) or 1 (HIGH). According to the output values, the respective mirror current sources 141, 142, and 143 are switched ON or OFF.

Each of the mirror current sources 141, 142, and 143 is switched ON at LOW value so that charging current flows into the capacitor C2 130. Thereafter, a charging voltage $V_{peak}$ in the capacitor C2 130 flows into the negative input node of the differential amplifier 110 and changes the output voltage $V_a$ such that new switching operations continuously take place. Specifically, by the time when a value of $V_a$ becomes the same as the reference voltage $V_{ref3}$, the mirror current sources 141, 142, and 143 are sequentially switched OFF and stop operating.

As described above, the mirror current sources 141, 142, and 143 with different binary weighted current ratios are connected in parallel with each other, so that the time taken to reach the peak value of a signal may be effectively reduced, as compared to the existing structure of the peak detector according to the related art. To assist in understanding of the present disclosure, the reduction in time will be described in detail with reference to FIGS. 4A to 4D.

Figure 4A:
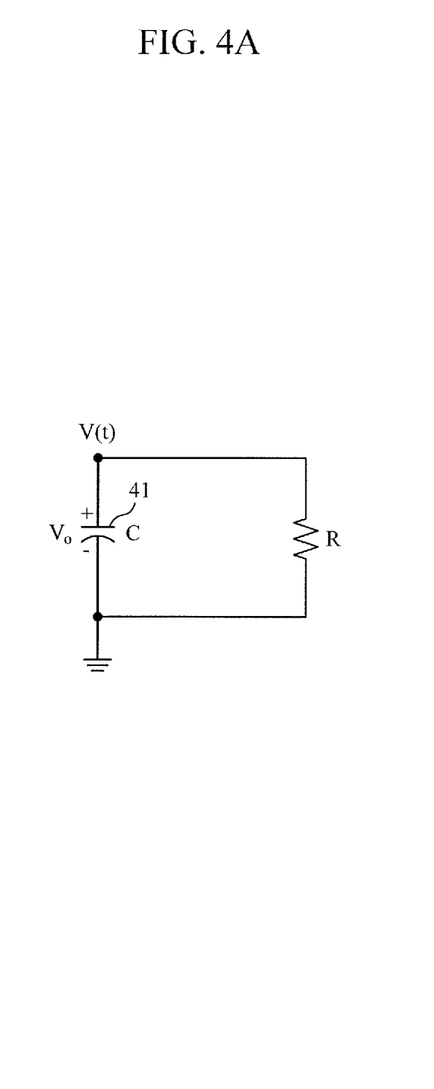
FIG. 4A is a circuit diagram for explaining a natural current discharge.

FIG. 4A is a circuit diagram showing a capacitor charged to a voltage of $V_o$ which naturally discharges via a resistor.

Referring to FIG. 4A, in the case of a capacitor 41 charged to a voltage of $V_o$, natural discharge of the capacitor 41 through a resistor is calculated by Equation 1 below.

$$v(t)=V_o e^{-t/RC} \quad (1)$$

where RC=$\tau$, $\omega_p=1/\tau$.

Figure 4B:
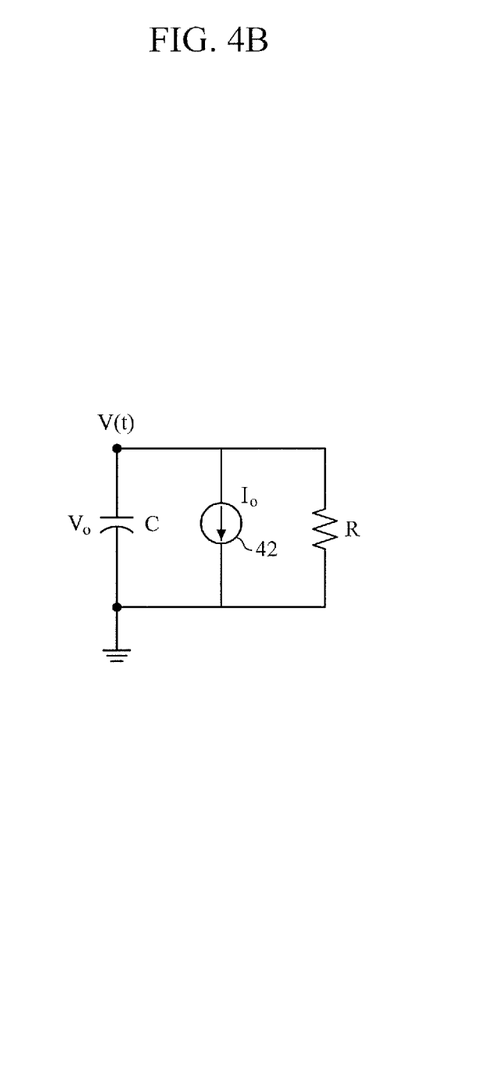
FIG. 4B is a circuit diagram illustrating a forced discharge when another discharge current source is inserted into the circuit shown in FIG. 4A.

FIG. 4B is a circuit diagram illustrating another discharge current source being inserted into the circuit shown in FIG. 4A.

Figure 4C:
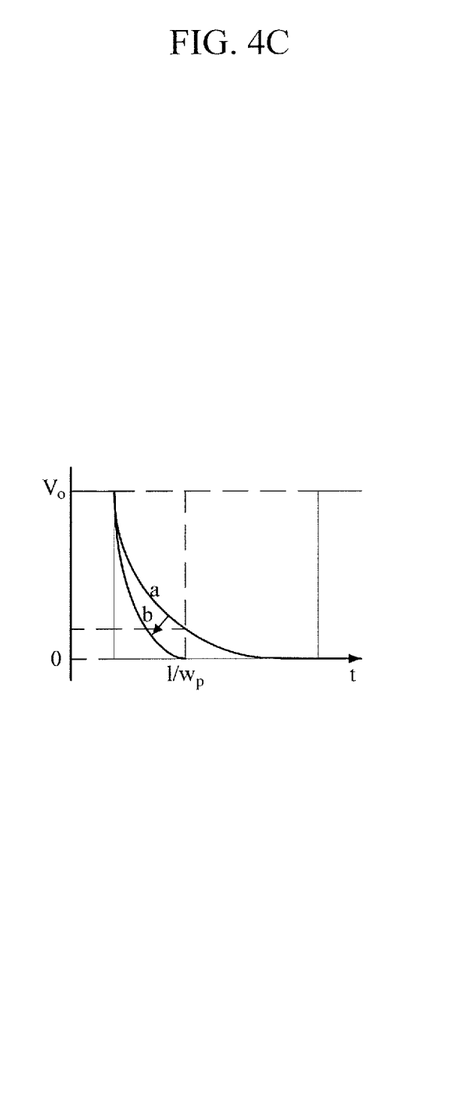
FIG. 4C is a graph showing response characteristics of the circuits shown in FIGS. 4A and 4B.

FIG. 4C is a graph showing response characteristics of the charging voltage $V_o$ in the circuits shown in FIGS. 4A and 4B.

Referring to FIG. 4C, a response characteristic (b) of the circuit of FIG. 4B appears sharper than a response characteristic (a) of the circuit of FIG. 4A. Referring back to FIG. 4B, this is because that the current source 42 is added, which is another current path, thereby accelerating the discharge of current, as compared to the natural discharge.

In contrast, when the principle as described above is applied to the charging process of the capacitor, a current source may be added to the circuit to be charged, so that the capacitor can be charged faster.

Figure 4D:
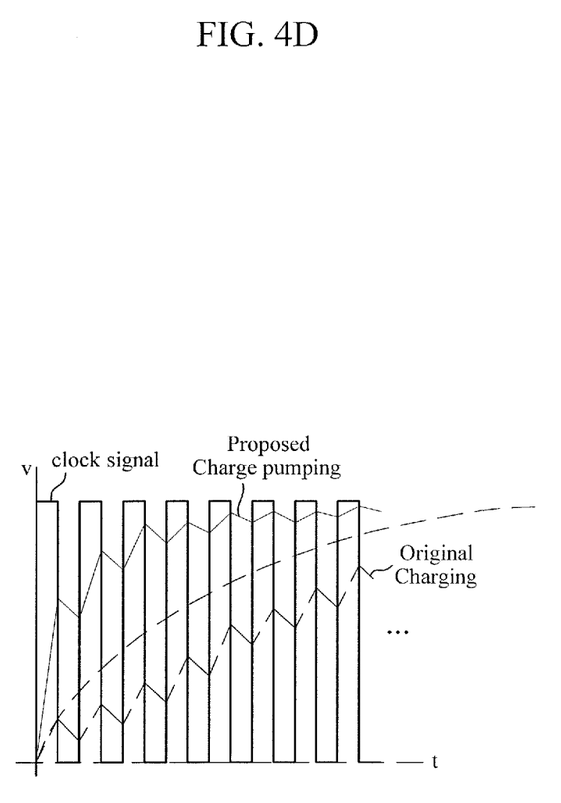
FIG. 4D is a graph showing a response characteristic of the circuit that is charged while being repeatedly charted and discharged.

FIG. 4D is a graph showing a response characteristic of the circuit that is charged while being repeatedly charged and discharged.

Referring to FIG. 4D, when a capacitor is charged with a single current source, as done in original charging, a substantially large amount of time is required for a charging voltage to reach a packet value of the signal. However, as shown in the proposed charge pumping, if the single current source and a number of mirror current sources with different binary weighted current ratios are utilized and appropriately switched, the voltage can reach a desired peak value faster.

That is, to reduce the charging time, a large amount of current is roughly supplied at the beginning of the charging process so that the charging voltage can easily reach a specific value. Thereafter, as the charging voltage approaches a peak value, minute current is appropriately supplied by taking into consideration the stability of circuit operation so as to enable the charging voltage to reach the peak value of the signal.

Figure 5:
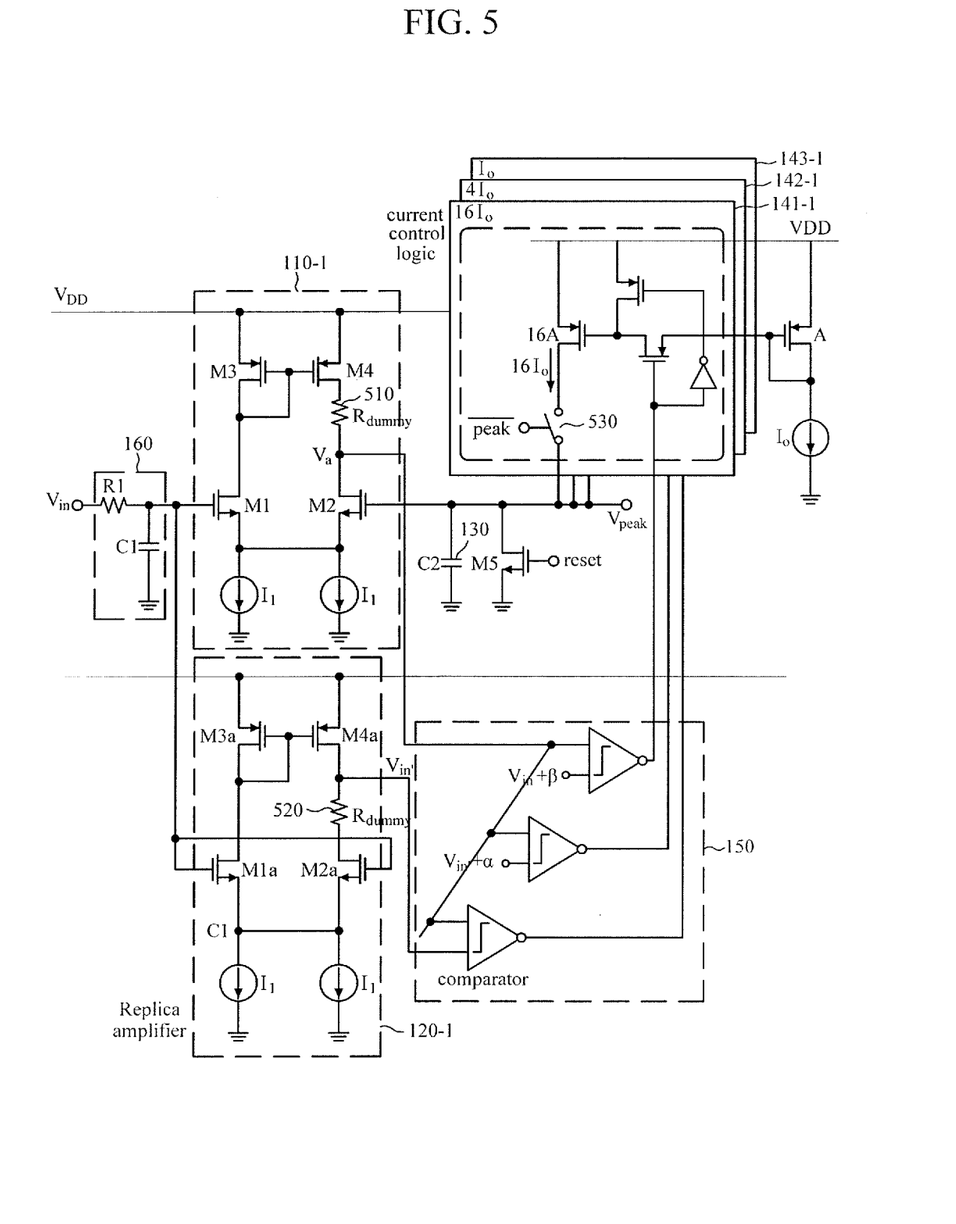
FIG. 5 is a diagram illustrating a configuration of the peak detector using a charge pump according to another exemplary embodiment.

FIG. 5 is a diagram illustrating a configuration of the peak detector using a charge pump according to another exemplary embodiment. Referring to FIG. 5, a capacitor C2 130, a current control logic 150, and a low pass filter 160 of the peak detector are the same as those shown in FIG. 2, whereas a differential amplifier 110-1 and a replica amplifier 120-1 of the peak detector shown in FIG. 5 include resistors $R_{dummy}$ 510 and 520, respectively. Specifically, the differential amplifier 110-1 includes a first MOSFET M1, a second MOSFET M2, a third MOSFET M3, a fourth MOSFET M4, and a resistor $R_{dummy}$ 510, wherein the first MOSFET M1 has a source connected to a current source and a gate connected to a positive input node; the second MOSFET M2 has a source connected to both the source of the first MOSFET M1 and a current source and a gate connected to a negative input node; the third MOSFET M3 has a source terminal connected to VDD, a gate connected to a gate of the fourth MOSFET M4, and a drain connected to a drain of the first MOSFET M1; the fourth MOSFET M4 has a source terminal connected to VDD, the gate connected to the gate and drain of the third MOSFET M3, and a drain connected to a drain of the second MOSFET M2; an output node to output an output voltage is formed at the drain of the fourth MOSFET M4; and the resistor $R_{dummy}$ 510 is added between the fourth MOSFET M4 and the output node. The replica amplifier includes a first MOSFET M1a, a second MOSFET M2a, a third MOSFET M3a, a fourth MOSFET M4a, and a resistor $R_{dummy}$ 520, wherein the first MOSFET M1a has a source connected to a current source and a gate connected to a positive input node; the second MOSFET M2a has a source connected to both a current source and the source of the first MOSFET M1a and a gate connected to a negative input node; the third MOSFET M3a has a source terminal connected to VDD, a gate connected to a gate of the fourth MOSFET M4a, and a drain connected to a drain of the first MOSFET M1a; the fourth MOSFET M4a has a source terminal connected to VDD, the gate connected to the gate and drain of the third MOSFET M3a, and a drain connected to a drain of the second MOSFET M2a; an output node to output an output voltage $V_{in'}$ is formed at the drain of the fourth MOSFET M4a; and the resistor $R_{dummy}$ 520 is added between the second MOSFET M2a and the output node. The resistors $R_{dummy}$ 510 and 520 create and apply the same DC voltage difference to $V_a$ and $V_{in}$. The positive input node and the negative input node of the replica amplifier are shortened.

A switch 530 is added to the mirror current source. In order to prevent a change of a value of voltage $V_{peak}$ due to leakage current during the high-speed switching, the switch 530 allows the mirror current source to have LOW value when a peak voltage is detected by a digital logic circuit, thereby separating the capacitor 130 and the mirror current sources from each other on the circuit.

Figure 6:
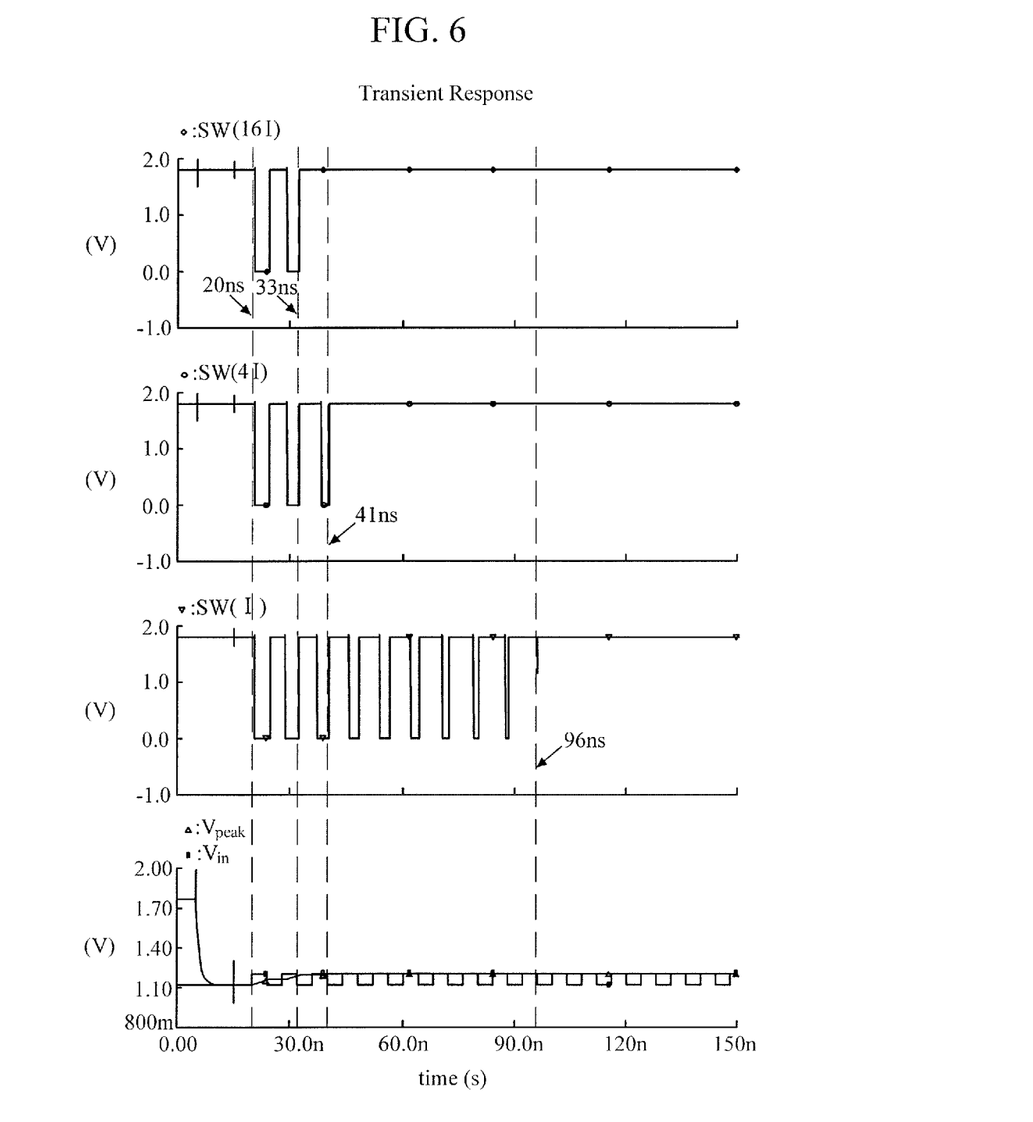
FIG. 6 illustrates graphs showing simulation waveforms by the peak detector according to the exemplary embodiment.

FIG. 6 illustrates graphs showing simulation waveforms by the peak detector according to the exemplary embodiment.

If an initial voltage $V_{peak}$ is a specific voltage of a power supply voltage VDD, a charging voltage $V_{peak}$ of the capacitor C2 discharges and is set to approximately 1.1 V in response to the input of a reset signal. The set voltage $V_{peak}$ is the same as a working DC voltage of an input transistor when there is no input signal. To obtain faster response characteristics, charging of voltage $V_{peak}$ is set to start at an input DC working voltage of the input signal $V_{in}$, rather than starting at 0 V. Thereafter, when a signal in the form of clock pulses is input, the mirror current sources are switched by the respective comparators.

As shown in FIG. 6, all switches 16 $I_o$, 4 $I_o$, and $I_o$ are switched ON during the period between 20 nsec and 33 nsec, so that the total of 21*$I_o$ current flows and charges the capacitor quickly. Then, switch of 16 $I_o$ is switched OFF, and after 41 nsec, switch of 4 $I_o$ is also switched OFF. Hence, only the switch $I_o$ that outputs minute current is repeatedly switched ON and OFF, charging the capacitor with the minute current, and precisely tracks a peak value of the input signal until 96 nsec at which it will be switched OFF.

Figure 7:
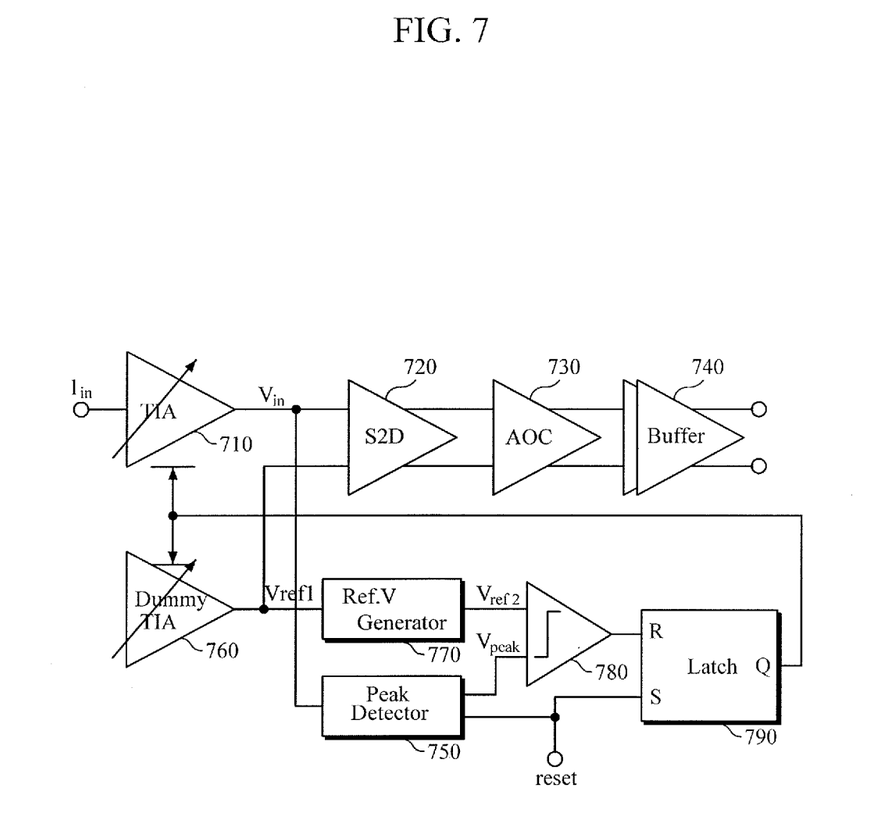
FIG. 7 is a diagram illustrating a burst-mode transimpedance amplifier (BM-TIA) using the signal peak detector according to an exemplary embodiment.

FIG. 7 is a diagram illustrating a burst-mode transimpedance amplifier (BM-TIA) using the signal peak detector according to an exemplary embodiment.

Referring to FIG. 7, the BM-TIA provides automatic gain control for optical signal packets according to intensity of packets wherein the optical signal packets are received in burst mode in a passive optical network (PON). Here, the reason for which the optical signal packets are received in burst mode is that distance or signal loss between an OLT side and each ONU side at which a subscriber is present varies. In the general PON which is configured in a point-to-multi-point (P2MP) scheme, signals from multiple ONU sides are transmitted in packets using a time division multiplexing PON (TDM-PON) mechanism. Therefore, the packets input to the OLT side have different signal strengths.

A TIA core 710 converts a current signal received from an external source into a voltage signal and amplifies the voltage signal. A single-to-differential (S2D) amplifier 720 converts the single voltage signal output from the TIA core 710 into a first differential signal and amplifies the first differential signal. An auto offset cancellation (AOC) amplifier 730 removes DC offset from the amplified first differential signal, then amplifies the resulting signal to create a second differential signal and outputs it. A buffer amplifier 740 receives the second differential signal and outputs a differential output signal to an external device.

A peak detector 750 detects a peak voltage $V_{peak}$ of the signal output from the TIA core 710, wherein the peak detector 750 with the configuration as shown in FIG. 2 detects the peak voltage $V_{peak}$ of an applied input signal voltage $V_{in}$.

A dummy TIA 760 is configured the same as the TIA core 710 and generates and outputs a first reference voltage $V_{ref1}$.

A reference voltage generator 770 receives the first reference voltage $V_{ref1}$ and generates a second reference voltage $V_{ref2}$.

Then, the comparator 780 compare the peak voltage $V_{peak}$ output from the peak detector 750 to the reference voltage $V_{ref2}$ of the reference voltage generator 770 and sends a comparison result to a latch 790.

The latch 790 maintains the existing value, which was determined after reset by a reset pulse, until a next reset signal is input. If the peak voltage $V_{peak}$ is greater than the reference voltage $V_{ref2}$, the latch 790 decreases the gain of the TIA core 710 through a feedback signal. On the contrary, if the peak voltage $V_{peak}$ is smaller than the reference voltage $V_{ref2}$, the latch 790 maintains the high gain of the TIA core 710.

The determination as to whether the input burst signal is loud or soft is based on the reference voltage $V_{ref2}$. Generally, a value of the reference voltage is internally determined by taking into consideration the number of pins. In the present disclosure, the reference voltage $V_{ref2}$ is provided by the TIA core 750 and the dummy TIA that changes constantly with respect to processes, temperature and time, so that the reference voltage $V_{ref2}$ can have a relative value that changes in proportion to any changes.

The peak detector according to the exemplary embodiments does not use a diode and hence exhibits a high degree of integration, as well as can precisely detect a signal peak value at a high speed. Also, high-speed diode device processing is not needed, so that the processing cost and processing period can be reduced.

The current embodiments can be implemented as computer readable codes in a computer readable record medium. Codes and code segments constituting the computer program can be easily inferred by a skilled computer programmer in the art. The computer readable record medium includes all types of record media in which computer readable data are stored. Examples of the computer readable record medium include a ROM, a RAM, a CD-ROM, a magnetic tape, a floppy disk, and an optical data storage. Further, the record medium may be implemented in the form of a carrier wave such as Internet transmission. In addition, the computer readable record medium may be distributed to computer systems over a network, in which computer readable codes may be stored and executed in a distributed manner.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A peak detector using a charge pump, comprising:
   a differential amplifier configured to receive an input signal to be detected through an input node and amplify the received signal;
   a current control logic configured to create two or more current control signals by comparing a signal output from the differential amplifier with two or more reference voltages;
   a mirror current source portion comprising two or more mirror current sources configured to be driven respectively by the current control signals from the current control logic;
   a capacitor configured to be charged or discharged by currents output from the mirror current sources; and
   a reset circuit configured to reset a voltage of the capacitor; and
   a replica amplifier configured to be the same as the differential amplifier, the replica amplifier including two differential input nodes connected with a same input signal as that input to the differential amplifier and providing a reference voltage to be applied to the current control logic, wherein the reference voltage is insensitive to changes in process and associated with a state of the input signal.

2. The peak detector of claim 1, wherein in order to detect a positive peak value, the differential amplifier receives both an input signal voltage Vin to be detected through a positive input node and a charged feedback voltage from the capacitor through a negative input node and generates a positive output voltage Va by amplifying a difference between the input signal voltage Vin and the feedback voltage.

3. The peak detector of claim 1, wherein in order to detect a negative peak value, the differential amplifier receives both an input signal voltage Vin to be detected through a positive input node and a charged feedback voltage from the capacitor through a negative input node and generates a negative output voltage Va by amplifying a difference between the input signal voltage Vin and the feedback voltage.

4. The peak detector of claim 1, wherein the current control logic comprises a plurality of comparators with hysteresis characteristics which compare the output voltage Va from the differential amplifier with two or more reference voltages and generate signals to control the mirror current source portion.

5. The peak detector of claim 1, wherein the mirror current source portion comprises: the two or more mirror current sources which are connected in parallel with each other and driven by the current control signals; and switches which are separate from the capacitor to stabilize a peak detection voltage Vpeak after peak detection.

6. The peak detector of claim 1, wherein:
   in a case where a positive peak value of the input signal is to be detected, the capacitor that has been set to a lowest voltage by the reset circuit is charged by currents of the mirror current source portion charge; and
   in a case where a negative peak value of the input signal is to be detected, the capacitor that has been set to a highest voltage by the reset circuit is discharged by currents of the mirror current source portion.

7. The peak detector of claim 1, further comprising:
   a low pass filter (LPF) configured to remove direct current (DC) wander from the input signal voltage Vin to be detected, select only a stable clock, and input a resulting signal to both the differential amplifier and a replica amplifier which are connected in parallel with each other.

8. The peak detector of claim 1, wherein the current control logic comprises a plurality of comparators that receive the output voltage Va and output either a value of 0 (LOW) or 1 (HIGH) by comparing the received output voltage Va with two or more reference voltages Vrefa, Vrefb, and so on, wherein the output values from the comparators are used to switch the mirror current sources, respectively.

9. The peak detector of claim 1, wherein the mirror current source portion comprises the mirror current sources with different binary weighted current ratios respectively, and the mirror current sources are all operated at a beginning stage of peak detection after reset by a reset pulse and they are sequentially switched OFF over time, starting from the mirror current source with a highest binary weighted current ratio.

10. The peak detector of claim 1, wherein:
the differential amplifier comprises a first MOSFET M1, a second MOSFET M2, a third MOSFET M3, and a fourth MOSFET M4, wherein the first MOSFET M1 has a source connected to a current source and a gate connected to a positive input node; the second MOSFET M2 has a source connected to both a current source and the source of the first MOSFET M1, and a gate connected to a negative input node; the third MOSFET M3 has a source terminal connected to VDD, a gate connected to a gate of the fourth MOSFET M4, and a drain connected to a drain of the first MOSFET M1; and
the fourth MOSFET M4 has a source terminal connected to VDD, the gate connected to the gate and drain of the third MOSFET M3, and a drain connected to a drain of the second MOSFET M2, and
an output node to output the output voltage Va is formed at the drain of the fourth MOSFET M4, wherein a resistor Rdummy is added between the fourth MOSFET M4 and the output node.

11. The peak detector of claim 1, wherein:
the replica amplifier comprises a first MOSFET M1a, a second MOSFET M2a, a third MOSFET M3a, and a fourth MOSFET M4a, wherein the first MOSFET M1a has a source connected to a current source and a gate connected to a positive input node; the second MOSFET M2a has a source connected to both a current source and the source of the first MOSFET M1a, and a gate connected to a negative input node; the third MOSFET M3a has a source terminal connected to VDD, a gate connected to a gate of the fourth MOSFET M4a, and a drain connected to a drain of the first MOSFET M1a;
and the fourth MOSFET M4a has a source terminal connected to VDD, the gate connected to the gate and drain of the third MOSFET M3a, and a drain connected to a drain of the second MOSFET M2a,
an output node to output the output voltage Vin' is formed at the drain of the fourth MOSFET M4a, wherein a resistor Rdummy is added between the second MOSFET M2a and the output node, and
the positive input node and the negative input node of the replica amplifier are shorted.

12. A burst-mode transimpedance amplifier (BM-TIA) comprising:
a TIA core configured to convert a current signal input from an external source into a voltage signal and amplify the voltage signal;
a single-to-differential (S2D) amplifier configured to convert the single voltage signal output from the TIA core into a first differential signal and amplify the first differential signal;
an auto offset cancellation (AOC) amplifier configured to remove DC offset from the amplified first differential signal output from the S2D amplifier and amplify a resulting signal, thereby outputting a second differential signal;
a buffer amplifier configured to receive the second differential signal and output a differential output signal to an external device by amplifying the second differential signal;
a peak detector configured to detect a peak voltage Vpeak of the voltage signal output from the TIA core;
a dummy TIA configured to be the same as the TIA core and generate a first reference voltage Vref1;
a reference voltage generator configured to receive the first reference voltage Vref1 and generate a second reference voltage Vref2;
a comparator configured to compare the peak voltage Vpeak and the second reference voltage Vref2 and output a comparison result value; and
a latch configured to provide time synchronization to a reset pulse signal according to the comparison result value output from the comparator,
wherein an output signal from the latch is fed back to the TIA core and the dummy TIA so as to be used as a signal to control the gain of TIA core and dummy TIA.

13. The BM-TIA of claim 12, wherein the peak detector comprises:
a differential amplifier configured to receive an input signal to be detected through an input node and amplify the received signal;
a current control logic configured to create two or more current control signals by comparing a signal output from the differential amplifier with two or more reference voltages;
a mirror current source portion comprising two or more mirror current sources configured to be driven respectively by the current control signals from the current control logic;
a capacitor configured to be charged or discharged by currents output from the mirror current sources; and
a reset circuit configured to reset a voltage of the capacitor.

14. The BM-TIA of claim 13, wherein:
in order to detect a positive peak value, the differential amplifier receives both an input signal voltage Vin to be detected through a positive input node and a charged feedback voltage from the capacitor through a negative input node and generates a positive output voltage Va by amplifying a difference between the input signal voltage Vin and the feedback voltage, and
in order to detect a negative peak value, the differential amplifier receives both an input signal voltage Vin to be detected through a positive input node and a charged feedback voltage from the capacitor through a negative input node and generates a negative output voltage Va by amplifying a difference between the input signal voltage Vin and the feedback voltage.

15. The BM-TIA of claim 13, wherein the current control logic comprises a plurality of comparators with hysteresis characteristics which compare the output voltage Va from the differential amplifier with two or more reference voltages and generate signals to control the mirror current source portion.

16. The BM-TIA of claim 13, wherein the mirror current source portion comprises: the two or more mirror current sources which are connected in parallel with each other and driven by the current control signals; and switches which are separate from the capacitor to stabilize a peak detection voltage Vpeak after peak detection.

17. The BM-TIA of claim 13, wherein a replica amplifier is further provided, which is configured to be the same as the differential amplifier, have two differential input nodes connected with a same input signal as that input to the differential amplifier, and provide a reference voltage to be applied to the current control logic, wherein the reference voltage is insensitive to changes in process and associated with a state of the input signal.

18. The BM-TIA of claim 13, wherein the current control logic comprises a plurality of comparators that receive the output voltage Va and output either a value of 0 (LOW) or 1 (HIGH) by comparing the received output voltage Va with two or more reference voltages Vref11, Vref22, and so on, wherein the output values from the comparators are used to switch the mirror current sources, respectively.

19. The BM-TIA of claim 13, wherein the mirror current source portion comprises the mirror current sources with different binary weighted current ratios respectively, and the mirror current sources are all operated at a beginning stage of peak detection after reset by a reset pulse and they are sequentially switched OFF over time, starting from the mirror current source with a highest binary weighted current ratio.

* * * * *